United States Patent
Andersen et al.

(10) Patent No.: US 6,803,541 B2
(45) Date of Patent: Oct. 12, 2004

(54) APPARATUS FOR A WELDING MACHINE HAVING A COOLING ASSEMBLY MOUNTED TO A MID-PLANE BAFFLE FOR IMPROVED COOLING WITHIN THE WELDING MACHINE

(75) Inventors: Bryan P. Andersen, Appleton, WI (US); David A. Werba, Oshkosh, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/063,816

(22) Filed: May 15, 2002

(65) Prior Publication Data

US 2003/0213789 A1 Nov. 20, 2003

(51) Int. Cl.⁷ ................................................ B23K 9/10
(52) U.S. Cl. .................................... 219/130.1; 219/136
(58) Field of Search ........................ 219/130.1, 130.31, 219/130.32, 130.33, 130.5, 137 PS, 136; 361/695

(56) References Cited

U.S. PATENT DOCUMENTS

| | | | | |
|---|---|---|---|---|
| 2,171,643 A | * | 9/1939 | Brenkert | ..................... 361/695 |
| 2,490,354 A | * | 12/1949 | Hobart | |
| 2,957,118 A | * | 11/1960 | Steinent et al. | |
| 3,253,118 A | * | 5/1966 | Frederick | .................. 219/130.5 |
| 5,061,433 A | * | 10/1991 | Gente et al. | ................. 376/260 |
| 5,642,260 A | * | 6/1997 | Sigl | ........................... 361/695 |
| 5,747,773 A | * | 5/1998 | Griffin et al. | ............ 219/130.1 |
| 5,831,240 A | * | 11/1998 | Katooka et al. | ......... 219/130.1 |
| 6,081,423 A | * | 6/2000 | Griffin | |
| 6,489,591 B1 | * | 12/2002 | Achtner | ................... 219/130.1 |

OTHER PUBLICATIONS

Miller Electric Mfg. Co., Owner's Manual for Syncrowave 180 SD , 2002.

* cited by examiner

Primary Examiner—Clifford C. Shaw
(74) Attorney, Agent, or Firm—Ziolkowski Patent Solutions Group, LLC

(57) ABSTRACT

A mid-plane baffle or plate having a fan mounted thereto to dissipate heat within a welding machine is provided. By centrally positioning a baffle and mounting a circulating fan thereto, cooling efficiency is improved thereby enabling more direct cooling of the internal components of the welding machine. The baffle also reduces the critical volume of the welding machine and allows the fan to operate more efficiently and pull an increased amount of cooler ambient air through the machine which creates a greater cooling effect during the cooling cycle of the machine. The baffle placement also improves welding start performance by operating as a barrier between the high frequency/high voltage components and the PC board (control electronics) of the welding machine. The baffle also improves flexibility of component placement within the welding machine.

23 Claims, 3 Drawing Sheets

APPARATUS FOR A WELDING MACHINE HAVING A COOLING ASSEMBLY MOUNTED TO A MID-PLANE BAFFLE FOR IMPROVED COOLING WITHIN THE WELDING MACHINE

BACKGROUND OF INVENTION

The present invention relates generally to welding machines and, more particularly, to a welding machine having a mid-plane baffle for improved heat dissipation/cooling of the welding machine.

There are a large number of welding processes available for use in the industry. The most common welding processes include gas tungsten arc, oxygen gas welding, and shielded metal arc welding. The gas tungsten arc welding process is sometimes referred to as TIG (tungsten inert gas) welding. TIG welding is commonly performed by a TIG welding machine utilizing an inert gas.

A typical TIG welding machine includes a transformer, stabilizer and various electrical components that convert the input power into power suitable for welding. The transformer, stabilizer and electrical components are usually assembled into an enclosure or housing having a fan to dissipate heat generated by the components and thereby cool the internal housing.

Generally, the housing is defined by a front and back panel, two side panels, a base plate, and a top cover. The panels, base plate, and top cover collectively define a cavity or volume wherein the internal components of the welding machine are mounted. Typically, the fan is mounted to an external panel to dissipate heat generated throughout the housing. While the single cavity housing with an external panel mounted fan has adequately dissipated heat generated by the internal welding machine components, improved cooling efficiency is difficult to achieve without an increased size of the fan thereby increasing the overall manufacturing costs of the welding machine.

It would therefore be desirable to design a welding apparatus that decreases the critical volume within the welding apparatus housing and allows for alternate placement of a fan assembly to improve heat dissipation within the housing.

SUMMARY OF INVENTION

The present invention solves the aforementioned problems by providing a mid-plane baffle or plate having a fan mounted thereto to dissipate heat within a welding machine. By centrally positioning a baffle and mounting a circulating fan thereto, cooling efficiency is improved thereby enabling more direct cooling of the internal components of the welding machine. The baffle also reduces the critical volume of the welding machine and allows the fan to operate more efficiently and pull an increased amount of cooler ambient air through the machine which creates a greater cooling effect during the cooling cycle of the machine. The baffle placement also improves welding start performance by operating as a barrier between the high frequency/high voltage components and the PC board (control electronics) of the welding machine. The baffle also improves flexibility of component placement within the welding machine.

In accordance with one aspect of the present invention, a welding apparatus includes a housing defined by a first and a second panel, a base plate, and a top cover plate. The welding apparatus further includes a baffle extending from the first panel to the second panel wherein the baffle is disposed to define a top compartment and a bottom compartment within the housing.

In accordance with another aspect of the present invention, a welding machine includes a front panel and a back panel. The welding machine further includes a base plate and top plate connecting the front panel and the back panel to form a housing. A cross plate parallel to the base plate and the top plate is provided such that the cross plate defines a first volume and a second volume within the housing. The fan assembly is supported by the cross plate to circulate air in the first and the second volumes.

In accordance with a further aspect of the present invention, a method of manufacturing a welding machine with improved cooling efficiency is provided. The method includes the steps of connecting a first panel and a second panel to opposite ends of a base plate. The method also includes connecting a baffle plate having an opening parallel to the base plate such that the baffle plate generally bisects a height of each panel to form a first volume and a second volume. A fan is then positioned in the baffle plate opening wherein the fan is configured to circulate air in the first and the second volumes. A cover plate is then connected between the first panel and the second panel to enclose the internal components of the welding machine.

In accordance with yet a further aspect of the present invention, a cooling assembly kit for retrofitting a welding apparatus is provided. The cooling assembly kit includes a baffle plate having a bore configured to generally bisect an internal volume of the welding apparatus to form a first volume and a second volume. The cooling assembly kit further includes a fan assembly attached to the baffle plate through the bore to circulate air in the first and the second volumes.

Various other features, objects and advantages of the present invention will be made apparent from the following detailed description and the drawings.

BRIEF DESCRIPTION OF DRAWINGS

The drawings illustrated the best mode presently contemplated for carrying out the invention.

In the drawings.

DETAILED DESCRIPTION

Figure 1:
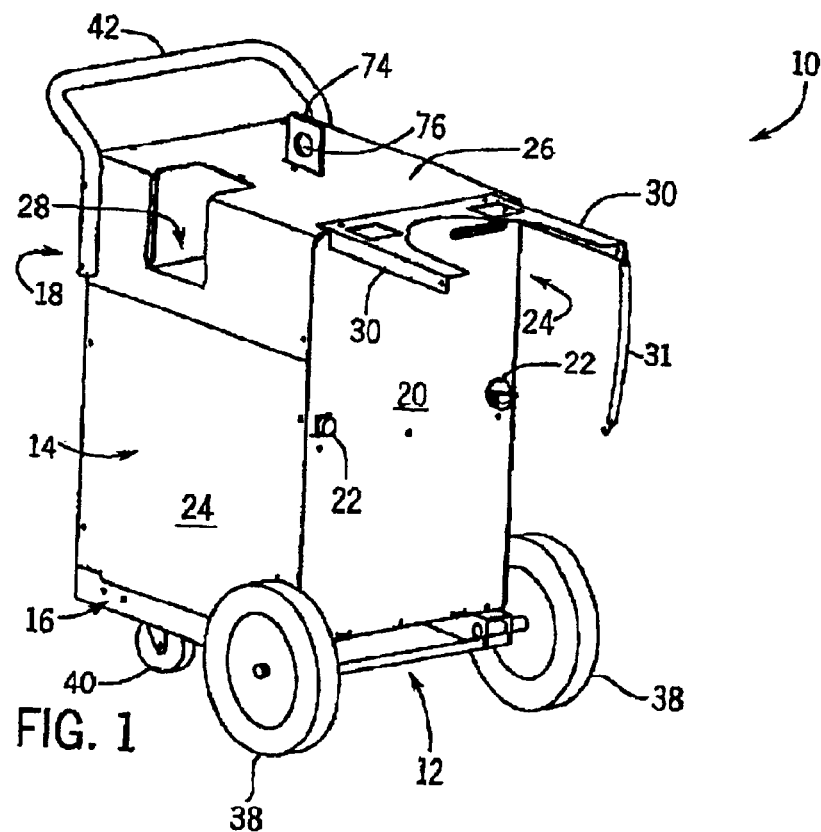
FIG. 1 is a perspective view of a welding machine.

FIG. 1 is a perspective view of a welding machine 10, incorporating in one embodiment, a retractable rack assembly 12. The welding machine 10 comprises a housing 14 having a base 16, and a plurality of panels spaced apart from one another and extending upwardly from the base 16. The plurality of panels includes a front panel 18 with control knobs and switches (not shown), a back panel 20 with control knobs and/or valves 22 and a pair of side panels 24. A top cover 26 is secured to the panels that collectively enclose the internal components of the welding machine 10. The top cover 26 has an opening 28 to allow access to the interior of the housing 14. Panels 20, 24 and top cover 26 are preferably fabricated from blank sheet metal as is well known in the art. A pair of support bars 30 extend outwardly from housing 14 and a strap 31 to support an upper portion of a gas cylinder (not shown). The retractable rack assembly 12 supports the body of a gas cylinder when extended outwardly from base 16. Alternately, welding machine 10 may be constructed without rack assembly 12 and support bars 30 and strap 31 for welding conditions/sites not in need of a gas cylinder.

Rack assembly 12 is slidably coupled to the base 16 of the housing 14 to allow retraction of the rack assembly 12 into a closed position. In the closed position, rack assembly 12 is engaged with base 16 of housing 14. A locking device (not shown) couples the rack assembly to the base on both sides of the housing. Wheels 38, 40 and handle 42 enable the welding machine 10 to be maneuvered and transported with ease to different job sites. Each wheel 38 may be equipped with a wheel-locking mechanism (not shown) to limit the transportability of the welding machine. Wheel 40 is coupled to an undersurface of the base 16 and is configured to freely pivot to assist with turning of the welding machine. Alternately, machine 10 may be constructed without wheels 38, 40 and handle 42 for non-transportable embodiments.

Figure 2:
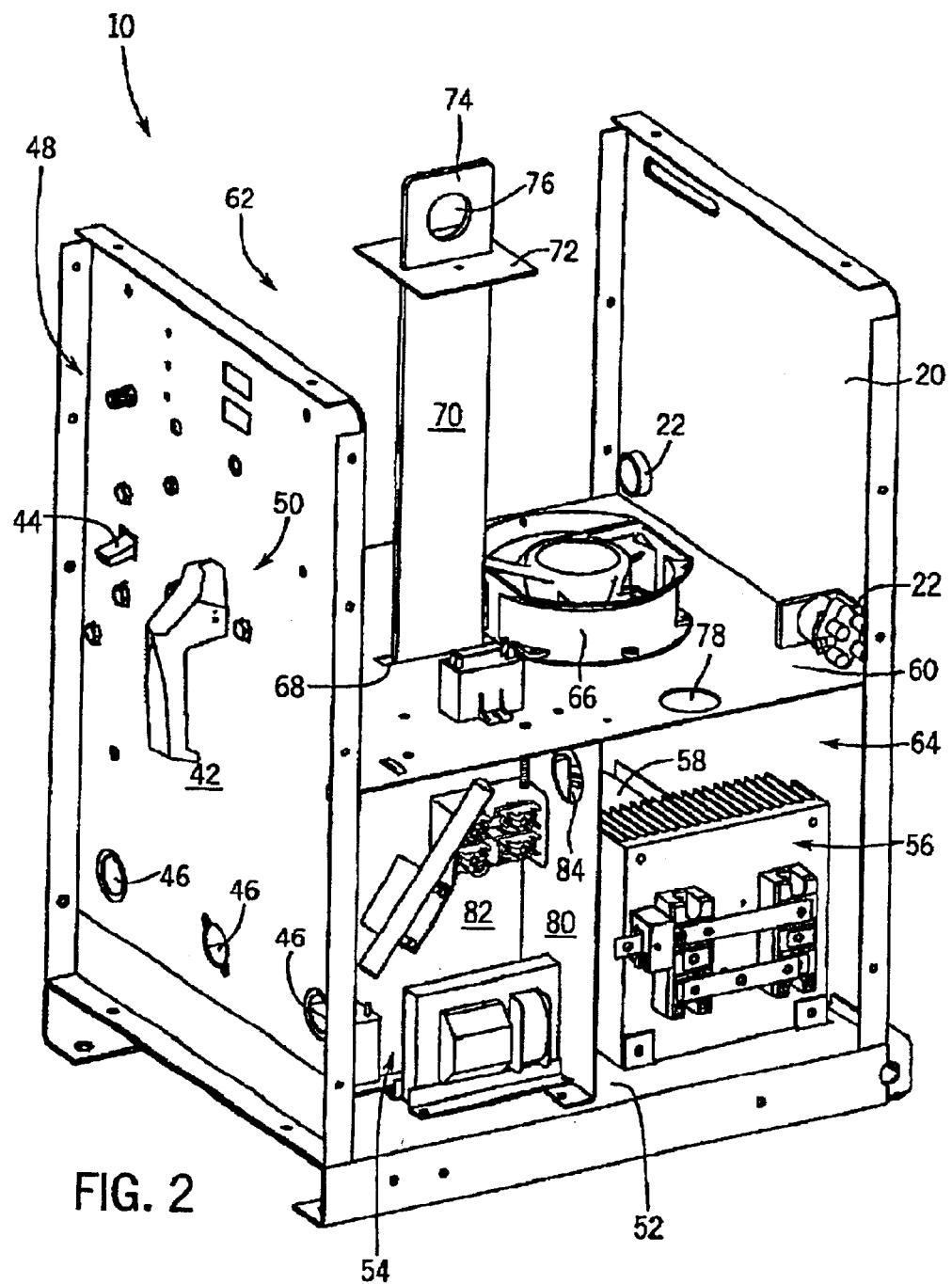
FIG. 2 is an assembled perspective view of the internal components of the welding machine of FIG. 1.

Referring now to FIG. 2, an assembled perspective view of the internal components of a welding machine similar to that shown in FIG. 1 is illustrated. The internal frame of welding machine 10 includes back panel 20 and a front mounting plate 42. Extending through mounting plate 42 is an on/off switch 44 and a number of sockets 46 configured to engage various welding plugs and connectors such as a work cable, torch cable, and/or other service plugs and pins. Mounting plate 42 further supports control knobs 48 for control and operation of the welding machine. As will be described with greater detail with respect to FIG. 4, mounting plate 42 further includes a number of fasteners 50 such as bolts that secure a support plate to an interior surface of mounting plate 42.

Connected between back panel 20 and mounting plate 42 is a base plate 52 configured to support the internal components of the welding machine 10. For example, base plate 52 supports a high frequency transformer assembly 54, a heat sink and rectifier assembly 56, and a stabilizer assembly 58. Transformer assembly 54, heat sink and rectifier assembly 56, and stabilizer assembly 58 will be described in greater detail with respect to FIG. 4.

Still referring to FIG. 2, to improve cooling and heat dissipation within the welding machine, the present invention incorporates a mid-plane baffle or plate 60 that generally bisects the internal volume of the welding machine to form a first volume 62 and a second volume 64. Baffle 60 supports a rotating fan 66 designed to dissipate heat in the first volume 62 as well as the second volume 64. Positioning baffle 60 to generally bisect the height of back panel 20 and mounting plate 42 reduces the critical volume of the welding machine 10 and allows the fan 66 to operate more efficiently by pulling an increased amount of cooler ambient air through the welding machine 10 which creates a greater cooling effect during the cooling cycle of the machine. Mid-plane placement of the baffle 60 also improves welding start performance as operating as a barrier between the high frequency/high voltage components and the PC board/ control electronics (not shown) of the welding machine. As will be discussed in greater detail below, the baffle 60 also improves flexibility of component placement within the welding machine.

Baffle 60 further includes a slot 68 that receives a frame support 70 extending from base plate 52 to the top of the welding machine 10. Frame support 70 includes a flange 72 for mounting top cover plate 26, FIG. 1. Extending from flange 72 through the top cover 26 as shown in FIG. 1 is a lifting plate 74 having a bore 76 therethrough. Bore 76 is designed to receive a chain so that welding machine 10 may be lifted by a crane or forklift assembly to transport the welding machine from one location to another. Additionally, a locking mechanism may be inserted through bore 76 to secure the welding machine 10 to a wall or other support structure to limit transportability of the welding machine.

Still referring to FIG. 2, baffle 60 includes at least one orifice 78 designed to allow air to pass between the first volume 62 and the second volume 64. Additionally, mounted to an undersurface of baffle 60 and extending orthogonally to base plate 52 is a pair of sectioning plates 80, 82. Sectioning plates 80, 82 serve as a divider between the high frequency transformer assembly 54 and the remaining internal components housed in the second volume 64. Sectioning plate 80 further includes an orifice 84 to allow air to circulate between the housing for the high frequency transformer 54 formed by sectioning plates 80, 82 and the remainder of the second volume 64. It is noted that sectioning plate 80 is perpendicular to the plane of support frame 70 whereas sectioning plate 82 is parallel to the plane of frame support 70. As indicated previously, sectioning plates 80, 82 operate to provide a housing for the high frequency transformer assembly 54 and thereby create a first compartment and a second compartment for housing internal components of welding machine 10 within the second volume 64.

Figure 3:
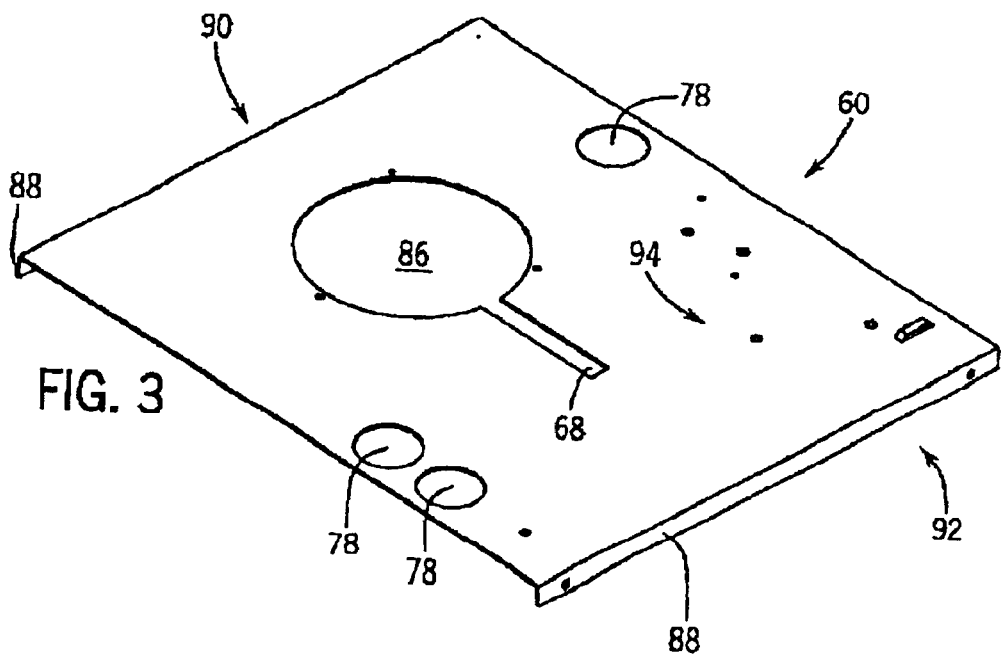
FIG. 3 is a perspective view of a baffle plate for use with the welding machine of FIG. 1.

Referring to FIG. 3, a perspective view of baffle 60 is illustrated. As shown, baffle 60 includes an orifice 86 in which fan 66 is mounted over. As such, fan 66 is able to dissipate heat in both the first volume and the second volume as heretofore described. Further shown in FIG. 3 is slot 68 for receiving support frame 70 and orifices 78 that allow air to communicate between the first and second volumes 62, 64. Baffle 60 further includes a 90° lip 88 at opposite ends 90, 92 so that baffle 60 may be fasteningly secured to mounting plate 42 and back panel 20 of FIG. 2. Baffle 60 further includes a number of fastening bores 94 configured to receive bolts or other fastening devices to securely mount additional welding components such as circuit boxes thereto.

Figure 4:
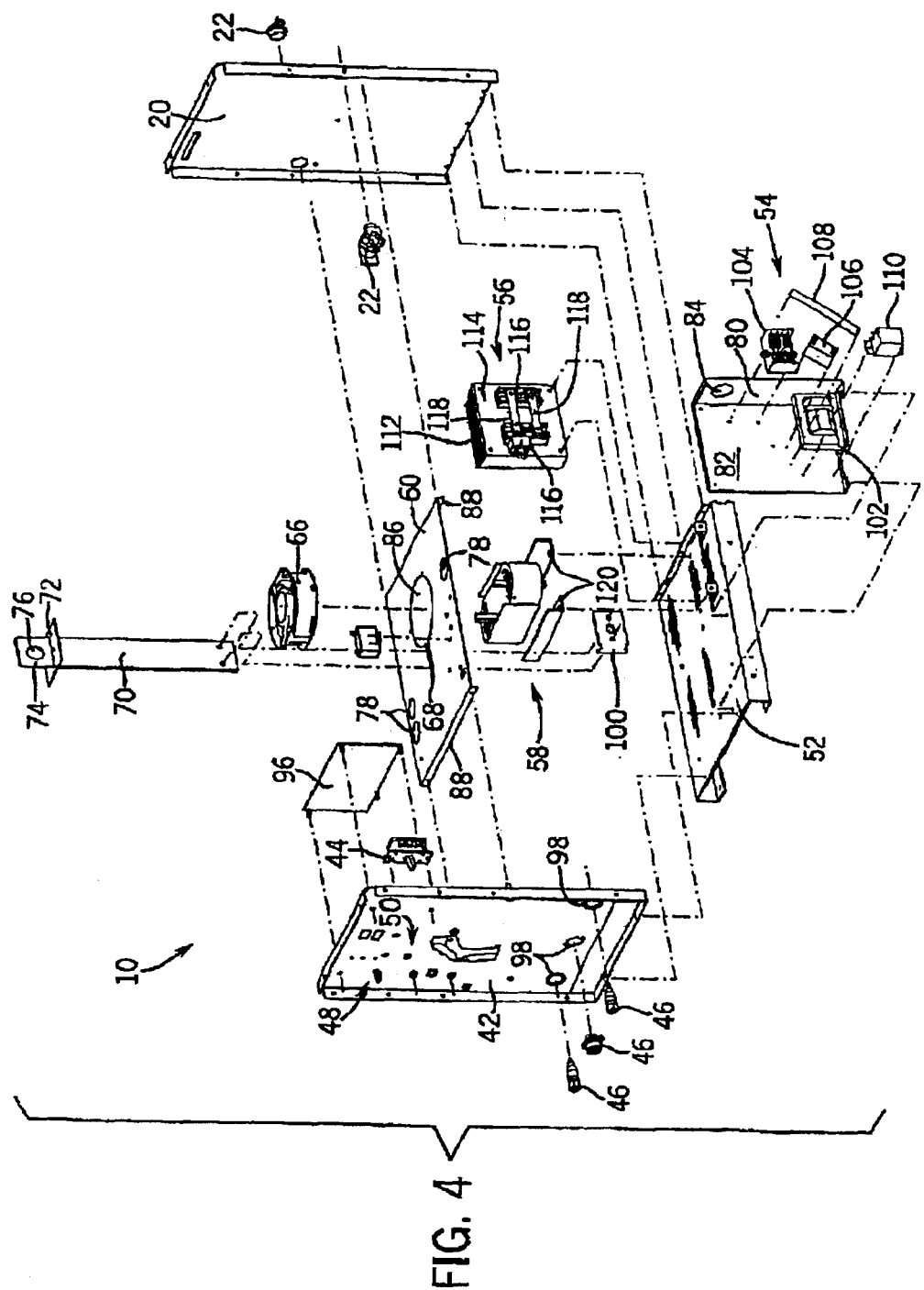
FIG. 4 is an exploded perspective view of that shown in FIG. 2.

Referring now to FIG. 4, an exploded view of that shown in FIG. 2 is illustrated. As indicated previously, mounting plate 42 is configured to support a switch 44 and control knobs 48. Switch 40 and controls 48 are secured to mounting plate 42 by a securing plate 96 that is affixed to an interior surface of mounting plate 42. Furthermore, sockets 46 are designed to engage orifices 98 of mounting plate 42. As indicated previously, sockets 46 are designed to receive various welding connectors such as a torch connector or work cable. The assembled mounting plate 42 is configured to be securely fastened to base plate 52 such that base plate 52 supports the vertical mounting plate 42. Additionally, base plate 52 is also designed to support back panel 20 along a side opposite to mounting plate 42 such that mounting plate 42, base plate 52, and back panel 20 collectively form a U-shaped frame. Bisecting mounting plate 42 and back panel 20 is baffle 60 designed to bisect the interior volume of the welding machine into a first volume and a second volume. Mounted through orifice 86 of baffle 60 is fan 66 designed to dissipate heat both the first volume and the second volume. A support frame 70 is designed to pass through a slot 68 of baffle 60 and attach to a mounting plate 100 that is mounted to stabilizer assembly 58. A transformer assembly (not shown) is also mounted to mounting plate 100 and supported by base plate 52. Support frame 70 extends vertically through the center of the welding machine and includes a flange that engages a top cover 26, FIG. 1, to support lifting of the welding machine by a crane or forklift.

As indicated previously, baffle 60 includes a number of orifices 78 to allow air communication between the first and second volumes and therefore provide a pressure equilibrium between the first and second volumes. Additionally, orifices 78 may be used for passing of wires between the two volumes. Preferably, baffle 60 is fabricated from a sheet of metal and includes lips 88 that enable securing of the baffle 60 to mounting plate 42 and rear panel 20 as shown.

As indicated previously, welding machine 10 further includes a housing defined by sectioning plates 80, 82 for a HF transformer assembly 54. Sectioning plates 80, 82 are mounted to and supported by base plate 52 to segment the second or lower volume into a first sub-volume and a second sub-volume as heretofore described. In accordance with know construction techniques, transformer assembly 54 includes an HF box 102 mounted to sectioning plate 82 as well as a transformer 104, a capacitor 106, and a resistor 108 that are collectively mounted to sectioning plate 82. Mounted to HF box 102 is a spark gap assembly 110.

Rectifier and heat sink assembly 56 includes a heat sink 112 mounted to a rectifier bracket 114. Rectifier assembly 56 further includes thyristors 116 and a pair of bus bars 118. Rectifier assembly 56 is mounted to and supported by base plate 52 and is sectioned from the high frequency transformer assembly 54 by sectioning plates 80, 82.

Also sectioned from HF transformer assembly 54 by sectioning plates 80, 82 is a stabilizer assembly 58. Stabilizer assembly 58 is supported by base plate 52 and mounted thereto by a pair of elbow-shaped brackets 120.

Accordingly, the present invention includes a method of manufacturing a welding machine with improved cooling efficiency. The method includes the steps of connecting a first panel and a second panel to opposite ends of the base plate and connecting a baffle plate having an opening parallel to the base plates such that the baffle plate generally bisects a height of each panel to form a first volume and a second volume within the internal housing of the welding machine. A fan is then positioned on the baffle plate opening such that heat may be dissipated in the first and second volumes. A cover plate is then connected between the first panel and the second panel to enclosed the internal components of the welding machine. Alternately, a pair of sectioning plates may be disposed between the baffle plate and the base plate to further section the second volume into a pair of sub-volumes. Additionally, the pair of sectioning plates also provide a housing for the high frequency transformer assembly. That is, the rectifier and heat sink assembly and stabilizer are positioned in a sub-volume separate from the sub-volume housing the HF transformer assembly. Manufacturing a welding machine in accordance with the aforementioned design enables flexibility and placement of the fan assembly to improve heat dissipation and air circulation within the welding machine. Additionally, as a result of a layout conducive to improved cooling, a smaller fan may be utilized or alternatively larger internal components with greater heat production. The present invention may also be embodied in a kit to retrofit a welding machine to improve the cooling efficiency of the device.

In accordance with one embodiment of the present invention, a welding apparatus includes a housing defined by a first and a second panel, a base plate, and a top cover plate. The welding apparatus further includes a baffle extending from the first panel to the second panel wherein the baffle is disposed to define a top compartment and a bottom compartment within the housing.

In accordance with another embodiment of the present invention, a welding machine includes a front panel and a back panel. The welding machine further includes a base plate and top plate connecting the front panel and the back panel to form a housing. A cross plate parallel to the base plate and the top plate is provided such that the cross plate defines a first volume and a second volume within the housing. The fan assembly is supported by the cross plate to circulate air in the first and the second volumes.

In accordance with a further embodiment of the present invention, a method of manufacturing a welding machine with improved cooling efficiency is provided. The method includes the steps of connecting a first panel and a second panel to opposite ends of a base plate. The method also includes connecting a baffle plate having an opening parallel to the base plate such that the baffle plate generally bisects a height of each panel to form a first volume and a second volume. A fan is then positioned in the baffle plate opening wherein the fan is configured to circulate air in the first and the second volumes. A cover plate is then connected between the first panel and the second panel to enclosed the internal components of the welding machine.

In accordance with yet a further embodiment of the present invention, a cooling assembly kit for retrofitting a welding apparatus is provided. The cooling assembly kit includes a baffle plate having a bore configured to generally bisect an internal volume of the welding apparatus to form a first volume and a second volume. The cooling assembly kit further includes a fan assembly attached to the baffle plate through the bore to circulate air in the first and the second volumes.

While the present invention has been described with respect to a phase controlled TIG welder, the present invention is equivalently applicable with an inverter controlled TIG welder, or a hybrid phase controlled/inverter controlled TIG welder. Additionally, the present invention is applicable with non-TIG welding machines and systems.

The present invention has been described in terms of the preferred embodiment, and it is recognized that the equivalent, alternatives, and modifications, aside from those expressly stated, are possible and within the scope of the appending claims.

What is claimed is:

1. A welding apparatus comprising:
   a housing defined by a first and a second panel, a base plate, and a top cover plate;
   a baffle extending from the first panel to the second panel, the baffle being disposed within the housing to define a top compartment and a bottom compartment within the housing;
   a sectioning plate extending from one of the base plate and the top cover plate to the baffle; and
   a fan configured to dissipate heat within the housing, the fan being supported by the baffle.

2. The welding apparatus of claim 1 wherein the baffle includes an orifice defined to receive the fan to dissipate heat within the housing.

3. The welding apparatus of claim 2 wherein the orifice is disposed in the baffle such that the fan circulates air in the top compartment and the bottom compartment.

4. The welding apparatus of claim 3 further comprising a transformer assembly, a rectifier assembly, a heat sink, and a stabilizer assembly disposed in the bottom compartment.

5. The welding apparatus of claim 1 wherein the baffle includes a mid-plane cross plate formed of sheet metal.

6. A welding machine comprising:
a front panel and a back panel;
a base plate and a top plate connecting the front panel and the back panel to form a housing;
a cross plate parallel to the base plate and the top plate such that the cross plate defines a first volume and a second volume within the housing;
a fan assembly supported by the cross plate to circulate air in the first and the second volumes; and
a box disposed in the second volume, the box being defined by a pair of sectioning plates.

7. The welding machine of claim 6 wherein the cross plate includes an orifice configured to receive the fan assembly such that the fan simultaneously circulates air in the first volume and the second volume.

8. The welding machine of claim 7 wherein the fan assembly is oriented parallel to the base plate and the top plate.

9. The welding machine of claim 6 further comprising at least a transformer assembly, a heat sink, a rectifier assembly, and a stabilizer assembly disposed in the second volume.

10. The welding machine of claim 9 wherein the transformer assembly is disposed in the box.

11. The welding machine of claim 6 incorporated into at least one of a phase controlled TIG welder, an inverter controlled TIG welder, and a hybrid phase controlled/inverter controlled TIG welder.

12. A method of manufacturing a welding machine with improved cooling efficiency, the method comprising the steps of:
connecting a first panel and a second panel to opposite ends of a base plate;
connecting a baffle plate having an opening parallel to the base plate such that the baffle plate generally bisects a height of each panel to form a first volume and a second volume;
connecting at least one sectioning plate between the baffle plate and the base plate;
positioning a fan in the baffle plate opening, the fan being configured to circulate air in the first and the second volumes; and
connecting a cover plate between the first panel and the second panel.

13. The method of claim 12 wherein the at least one sectioning plate comprises at least one pair of sectioning plates.

14. The method of claim 13 wherein the step of connecting the pair of sectioning plates includes the step of positioning the sectioning plates to be orthogonal to the baffle plate.

15. The method of claim 14 further comprising the step of defining a first sub-volume and a second sub-volume in the second volume with the connection of the pair of sectioning plates.

16. The method of claim 15 further comprising the step of positioning an HF transformer assembly in the first sub-volume and a heat sink and rectifier assembly in the second sub-volume.

17. A welding-type apparatus comprising:
a housing defined by a first and a second panel, a base plate, and a top cover plate;
a plurality of welding-type sockets disposed in the first panel, each welding-type socket configured to receive a welding-type component connector;
a plate extending from the first panel to the second panel, the plate being disposed within the housing to define a top compartment and a bottom compartment within the housing; and
at least one orifice formed in the plate to allow air communication between at least one of the top and the bottom compartment.

18. The welding-type apparatus of claim 17 further comprising a lifting eye to support lifting thereof.

19. The welding-type apparatus of claim 18 wherein the lifting eye is integrally formed with a frame support extending from the base plate.

20. The welding-type apparatus of claim 17 further comprising a plurality of wheels operationally supported by the base plate.

21. The welding-type apparatus of claim 17 wherein the at least one orifice is sized to receive a fan assembly designed to draw cooling air from the top compartment and deliver the cooling air to the bottom compartment.

22. A welding apparatus comprising:
a housing having a pair of panels connected to a base and a cover;
a baffle connected to the pair of panels and bisecting the housing so as to define a top volume and a bottom volume within the housing, the baffle having a fan assembly mounted thereto such that the fan assembly is situated co-planer with the baffle; and
a high frequency transformer assembly mounted within the bottom volume.

23. The welding apparatus of claim 22 further comprising at least one of a stabilizer assembly and a heat sink and rectifier assembly mounted within the bottom volume.

* * * * *